United States Patent
Kato et al.

(10) Patent No.: US 6,449,184 B2
(45) Date of Patent: Sep. 10, 2002

(54) METHOD FOR DRIVING SEMICONDUCTOR MEMORY

(75) Inventors: Yoshihisa Kato, Shiga; Yasuhiro Shimada, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/879,079

(22) Filed: Jun. 13, 2001

(30) Foreign Application Priority Data

Jun. 19, 2000 (JP) ........................... 2000-182642
Sep. 5, 2000 (JP) ........................... 2000-268270

(51) Int. Cl.[7] ................... G11C 11/22; G11C 11/24
(52) U.S. Cl. ........................... 365/145; 365/149
(58) Field of Search ........................... 365/145, 149

(56) References Cited

U.S. PATENT DOCUMENTS

| | | | | |
|---|---|---|---|---|
| 4,360,896 A | | 11/1982 | Brody ................ | 365/145 |
| 5,689,456 A | * | 11/1997 | Kobayashi ............ | 365/145 |
| 5,721,700 A | * | 2/1998 | Katoh ................ | 365/145 |
| 5,886,920 A | * | 3/1999 | Marshall et al. ...... | 365/145 |
| 5,912,835 A | * | 6/1999 | Katoh ................ | 365/145 |
| 6,141,238 A | * | 10/2000 | Forbes et al. ........ | 365/145 |
| 6,151,242 A | | 11/2000 | Takashima ............ | 365/145 |
| 6,198,652 B1 | * | 3/2001 | Kawakubo et al. ..... | 365/145 |
| 6,292,386 B1 | * | 9/2001 | Honigschmid ......... | 365/145 |

FOREIGN PATENT DOCUMENTS

| | | |
|---|---|---|
| JP | 02-198094 | 8/1990 |
| JP | 2777163 | 5/1998 |
| JP | 2000-22010 | 1/2000 |
| JP | 2000-022010 | 1/2000 |
| JP | 2000-156472 | 6/2000 |

OTHER PUBLICATIONS

European Search Report Mailing Date: Nov. 2, 2001.

* cited by examiner

*Primary Examiner*—Trong Phan
(74) *Attorney, Agent, or Firm*—Nixon Peabody LLP; Donald R. Studebaker

(57) ABSTRACT

In a method for driving a semiconductor memory including a ferroelectric capacitor for storing a multi-valued data in accordance with a displacement of polarization of a ferroelectric film and a detector connected to one of an upper electrode and a lower electrode of the ferroelectric capacitor for detecting the displacement of the polarization of the ferroelectric film, the multi-valued data is read by detecting the displacement of the polarization of the ferroelectric film by the detector under application of a reading voltage to the other of the upper electrode and the lower electrode of the ferroelectric capacitor, and then, the reading voltage applied to the latter electrode is removed. The reading voltage has such magnitude that the displacement of the polarization of the ferroelectric film is restored to that obtained before reading the multi-valued data by removing the reading voltage.

10 Claims, 14 Drawing Sheets

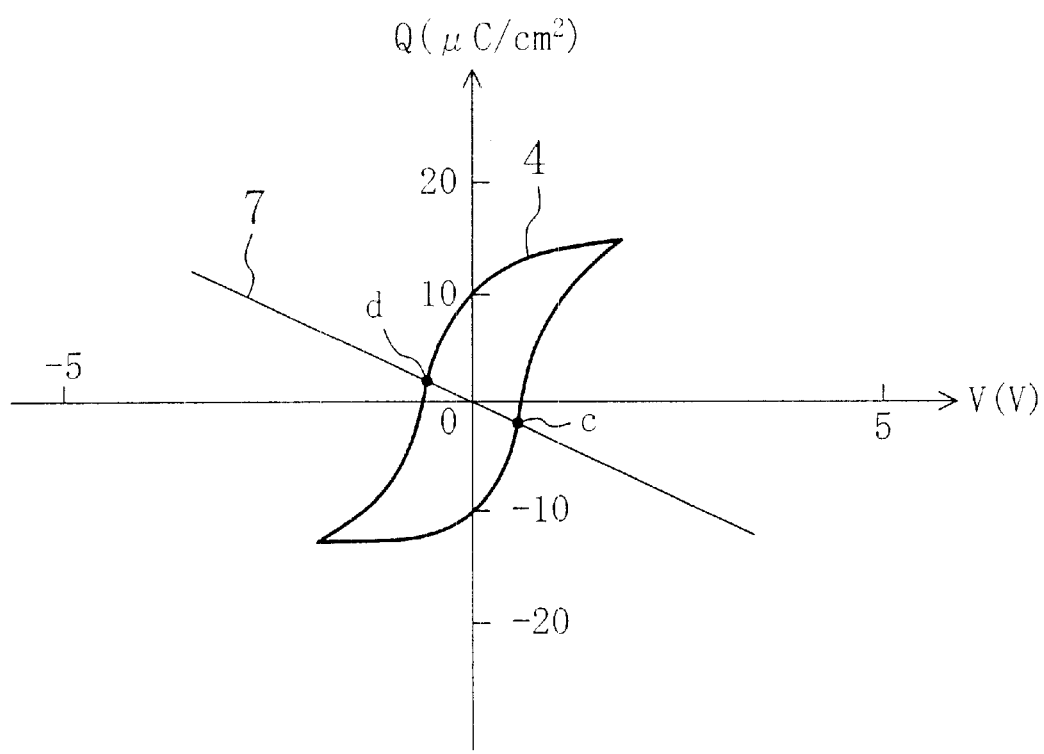

METHOD FOR DRIVING SEMICONDUCTOR MEMORY

BACKGROUND OF THE INVENTION

The present invention relates to a method for driving a semiconductor memory including a ferroelectric capacitor.

A first conventional example of a semiconductor memory including a ferroelectric capacitor is composed of, as shown in FIG. 15, a field effect transistor (hereinafter referred to as an FET) 1 and a ferroelectric capacitor 2, and a bit line BL is connected to a drain region 1a of the FET 1, an upper electrode of the ferroelectric capacitor 2 is connected to a source region 1b of the FET 1 and a word line WL is connected to a gate electrode 1c of the FET 1.

The semiconductor memory of the first conventional example employs the destructive read-out system in which a recorded data is erased in reading the data. Therefore, a rewrite operation is necessary to conduct after reading a data, and hence, an operation for reversing the polarization direction of a ferroelectric film (polarization reversing operation) should be carried out after every data read operation.

Since a phenomenon of polarization fatigue occurs in a ferroelectric film, the polarizing characteristic of the ferroelectric film is largely degraded when the polarization reversing operation is repeatedly carried out.

As a countermeasure, a semiconductor memory of a second conventional example shown in FIG. 16 has been proposed. The semiconductor memory of the second conventional example employs the non-destructive read-out system in which a lower electrode 2b of a ferroelectric capacitor 2 is connected to a gate electrode 1c of an FET 1 so as to use the ferroelectric capacitor 2 for controlling the gate potential of the FET 1. In FIG. 16, a reference numeral 3 denotes a substrate.

In writing a data in the semiconductor memory of the second conventional example, a writing voltage is applied between an upper electrode 2a of the ferroelectric capacitor 2 serving as a control electrode and the substrate 3.

For example, when a data is written by applying a voltage (control voltage) positive with respect to the substrate 3 to the upper electrode 2a, downward polarization is caused in a ferroelectric film 2c of the ferroelectric capacitor 2. Thereafter, even when the upper electrode 2a is grounded, positive charge remains in a gate electrode 1c of the FET 1, and hence, the gate electrode 1c has positive potential.

When the potential of the gate electrode 1c exceeds the threshold voltage of the FET 1, the FET 1 is in an on-state. Therefore, when a potential difference is caused between a drain region 1a and a source region 1b of the FET 1, a current flows between the drain region 1a and the source region 1b. Such a logical state of the ferroelectric memory is defined, for example, as "1".

On the other hand, when a voltage negative with respect to the substrate 3 is applied to the upper electrode 2a of the ferroelectric capacitor 2, upward polarization is caused in the ferroelectric film 2c of the ferroelectric capacitor 2. Thereafter, even when the upper electrode 2a is grounded, negative charge remains in the gate electrode 1c of the FET 1, and hence, the gate electrode 1c has negative potential. In this case, the potential of the gate electrode 1c is always smaller than the threshold voltage of the FET 1, and hence, the FET 1 is in an off-state. Therefore, even when a potential difference is caused between the drain region 1a and the source region 1b, no current flows between the drain region 1a and the source region 1b. Such a logical state of the ferroelectric memory is defined, for example, as "0".

Even when the power supply to the ferroelectric capacitor 2 is shut off, namely, even when the voltage application to the upper electrode 2a of the ferroelectric capacitor 2 is stopped, the aforementioned logical states are retained, and thus, a nonvolatile memory is realized. Specifically, when power is supplied again to apply a voltage between the drain region 1a and the source region 1c after shutting off the power supply for a given period of time, a current flows between the drain region 1a and the source region 1b if the logical state is "1", so that the data "1" can be read, and no current flows between the drain region 1a and the source region 1b if the logical state is "0", so that the data "0" can be read.

In order to correctly retain a data while the power is being shut off (which characteristic for retaining a data is designated as a retention characteristic), it is necessary to always keep the potential of the gate electrode 1c of the FET 1 to be higher than the threshold voltage of the FET 1 when the data is "1" and to always keep the potential of the gate electrode 1c of the FET 1 at a negative voltage when the data is "0".

While the power is being shut off, the upper electrode 2a of the ferroelectric capacitor 2 and the substrate 3 have ground potential, and hence, the potential of the gate electrode 1c is isolated. Therefore, ideally, as shown in FIG. 17, a first intersection c between a hysteresis loop 4 obtained in writing a data in the ferroelectric capacitor 2 and a gate capacitance load line 7 of the FET 1 obtained when a bias voltage is 0 V corresponds to the potential of the gate electrode 1c obtained in storing a data "1", and a second intersection d between the hysteresis loop 4 and the gate capacitance load line 7 corresponds to the potential of the gate electrode 1c obtained in storing a data "0". In FIG. 17, the ordinate indicates charge Q appearing in the upper electrode 2a (or the gate electrode 1c) and the abscissa indicates a voltage V.

Actually, however, the ferroelectric capacitor 2 is not an ideal insulator but has a resistance component, and hence, the potential of the gate electrode 1c drops through the resistance component. This potential drop is exponential and has a time constant obtained by multiplying parallel combined capacitance of the gate capacitance of the FET 1 and the capacitance of the ferroelectric capacitor 2 by the resistance component of the ferroelectric capacitor 2. The time constant is approximately $10^4$ seconds at most. Accordingly, the potential of the gate electrode 1c is halved within several hours.

Since the potential of the gate electrode 1c is approximately 1 V at the first intersection c as shown in FIG. 17, when the potential is halved, the potential of the gate electrode 1c becomes approximately 0.5 V, which is lower than the threshold voltage of the FET 1 (generally of approximately 0.7 V). As a result, the FET 1 that should be in an on-state is turned off in a short period of time.

In this manner, although the ferroelectric memory using the ferroelectric capacitor for controlling the gate potential of the FET has an advantage that a rewrite operation is not necessary after a data read operation, it has the following problem: The gate electrode of the FET obtains potential after writing a data, and the ability for keeping the gate potential determines the retention characteristic. Since the time constant until discharge of the ferroelectric capacitor is short, the data retaining ability is short, namely, the retention characteristic is not good.

SUMMARY OF THE INVENTION

In consideration of the aforementioned conventional problem, an object of the invention is improving the retention characteristic of a semiconductor memory including a ferroelectric capacitor for storing a multi-valued data in accordance with a displacement of polarization of a ferroelectric film.

In order to achieve the object, the first method of this invention for driving a semiconductor memory including a ferroelectric capacitor for storing a multi-valued data in accordance with a displacement of polarization of a ferroelectric film thereof and detection means connected to a first electrode corresponding to one of an upper electrode and a lower electrode of the ferroelectric capacitor for detecting the displacement of the polarization of the ferroelectric film, comprises a first step of reading the multi-valued data by detecting the displacement of the polarization of the ferroelectric film by the detection means with a reading voltage applied to a second electrode corresponding to the other of the upper electrode and the lower electrode of the ferroelectric capacitor; and a second step of removing the reading voltage applied to the second electrode, and the reading voltage applied in the first step has such magnitude that the displacement of the polarization of the ferroelectric film is restored to that obtained before reading the multi-valued data by eliminating the reading voltage in the second step.

In the first method for driving a semiconductor memory of this invention, the reading voltage applied in the first step has such magnitude that the displacement of the polarization of the ferroelectric film is restored to that obtained before reading the multi-valued data by removing the reading voltage in the second step. Therefore, in reading any multi-valued data stored in the ferroelectric capacitor, the read data is not destroyed, and hence, there is no need to carry out a data rewrite operation. Therefore, there is no need to carry out an operation for changing the polarization direction of the ferroelectric film (polarization reversing operation) after every data read operation. Accordingly, the ferroelectric film of the ferroelectric capacitor is minimally degraded through polarization fatigue, resulting in largely improving the read endurance characteristic of the semiconductor memory.

The first method for driving a semiconductor memory preferably further comprises, after the second step, a third step of making a potential difference between the upper electrode and the lower electrode of the ferroelectric capacitor zero.

When the potential difference between the upper electrode and the lower electrode of the ferroelectric capacitor is made zero after the second step, lowering of the potential difference through a resistance component of the ferroelectric capacitor disappears, resulting in improving the retention characteristic during the power is shut-off.

When the first method for driving a semiconductor memory comprises the third step of making the potential difference between the upper electrode and the lower electrode of the ferroelectric capacitor zero, the third step preferably includes a sub-step of applying a voltage with polarity different from polarity of the reading voltage to the first electrode before making the potential difference zero.

In this case, even when a voltage is applied for partially reversing the polarization of the ferroelectric film of the ferroelectric capacitor in data read, the magnitude of the polarization charge obtained after data read can be substantially equal to the magnitude of the polarization charge obtained before the data read. As a result, the disturb effect of the semiconductor memory can be largely eliminated.

When the first method for driving a semiconductor memory comprises the third step of making the potential difference between the upper electrode and the lower electrode of the ferroelectric capacitor zero, the semiconductor memory preferably includes a switch for equalizing the potentials of the first electrode and the second electrode of the ferroelectric capacitor, and the third step preferably includes a sub-step of making the potential difference zero with the switch.

In this manner, the potential difference between the upper electrode and the lower electrode of the ferroelectric capacitor can be easily and definitely made zero after the second step.

When the first method for driving a semiconductor memory comprises the third step of making the potential difference between the upper electrode and the lower electrode of the ferroelectric capacitor zero, the semiconductor memory preferably includes a switch for equalizing the potentials of the first electrode of the ferroelectric capacitor and potential, and the third step preferably includes a sub-step of applying a constant potential to the second electrode of the ferroelectric capacitor and making the potential difference zero with the switch.

In this manner, the potential difference between the upper electrode and the lower electrode of the ferroelectric capacitor can be easily and definitely made zero after the second step.

In the first method for driving a semiconductor memory, the reading voltage applied in the first step preferably has such magnitude that a voltage applied between the first electrode and the second electrode of the ferroelectric capacitor when the reading voltage is applied is smaller than a coercive voltage of the ferroelectric capacitor.

In this manner, the displacement of the polarization of the ferroelectric film can be definitely restored to that obtained before reading the data when the reading voltage applied in the first step is eliminated.

In the first method for driving a semiconductor memory, the detection means preferably has a load capacitor, the first step preferably includes a sub-step of applying the reading voltage to both ends of a series circuit composed of the ferroelectric capacitor and the load capacitor, and the detection means preferably detects the displacement of the polarization of the ferroelectric film by detecting a voltage applied to the load capacitor that is obtained by dividing the reading voltage in accordance with a ratio between the capacitance of the ferroelectric capacitor and capacitance of the load capacitor.

In this manner, the reading voltage applied in the first step is divided in accordance with the capacitance ratio between the ferroelectric capacitor and the load capacitor. Therefore, the voltage applied to the ferroelectric capacitor can be easily set to such magnitude that the displacement of the polarization of the ferroelectric film can be restored to that obtained before the data read when the reading voltage is removed.

In the first method for driving a semiconductor memory, the detection means preferably includes a field effect transistor formed on a substrate and having a gate electrode connected to the first electrode of the ferroelectric capacitor, the first step preferably includes a sub-step of applying the reading voltage between the second electrode of the ferroelectric capacitor and the substrate, and the detection means preferably detects the displacement of the polarization of the ferroelectric film by detecting a current flowing between a drain region and a source region of the field effect transistor when a voltage obtained by dividing the reading voltage in accordance with a ratio between the capacitance of the ferroelectric capacitor and the gate capacitance of the field effect transistor is applied to the gate electrode of the field effect transistor.

In this manner, the reading voltage applied in the first step can be divided in accordance with the capacitance ratio between the ferroelectric capacitor and the field effect transistor. Therefore, the voltage applied to the ferroelectric capacitor can be easily set to such magnitude that the displacement of the polarization of the ferroelectric film can be restored to that obtained before the data read when the reading voltage is removed. Furthermore, the displacement of the polarization of the ferroelectric film can be definitely detected by detecting the current flowing between the drain region and the source region of the field effect transistor.

The second method of this invention for driving a semiconductor memory including a plurality of successively connected ferroelectric capacitors each storing a multi-valued data in accordance with a displacement of polarization of a ferroelectric film thereof, a plurality of selecting transistors respectively connected to the plurality of ferroelectric capacitors for selecting the ferroelectric capacitors for reading the multi-valued data, and detection means connected to one end of the plurality of successively connected ferroelectric capacitors for reading the multi-valued data by detecting the displacement of the polarization of the ferroelectric film included in one ferroelectric capacitor selected by the selecting transistors, comprises a first step of applying a reading voltage to one of an upper electrode and a lower electrode of each of the ferroelectric capacitors; and a second step of removing the reading voltage applied to the one electrode, and the reading voltage applied in the first step has such magnitude that the displacement of the polarization of the ferroelectric film is restored to that obtained before reading the multi-valued data by removing the reading voltage in the second step.

In the second method for driving a semiconductor memory of this invention, even when any multi-valued data stored in the ferroelectric capacitors is read, there is no need to carry out a data rewrite operation similarly to the first driving method. Accordingly, the ferroelectric film of the ferroelectric capacitor is minimally degraded through the polarization fatigue, resulting in largely improving the read endurance characteristic of the semiconductor memory.

The second method for driving a semiconductor memory preferably further comprises, after the second step, a third step of making a potential difference between the upper electrode and the lower electrode of the ferroelectric capacitor zero.

In this manner, lowering of the potential difference through a resistance component of the ferroelectric capacitor disappears, resulting in improving the retention characteristic during the power is shut-off.

BRIEF DESCRIPTION OF THE DRAWINGS

FIGS. 10A and 10B are timing charts of a read operation of the semiconductor memory of Embodiment 2, wherein FIG. 10A is a timing chart employed when a data "1" is stored and FIG. 10B is a timing chart employed when a data "0" is stored;

FIG. 17 is a diagram for showing behavior of charge and voltage in a read operation of the semiconductor memory of the second conventional example.

DETAILED DESCRIPTION OF THE INVENTION

Embodiment 1

A semiconductor memory and a method for driving the semiconductor memory according to Embodiment 1 of the invention will now be described with reference to FIGS. 1 through 4.

Figure 1:
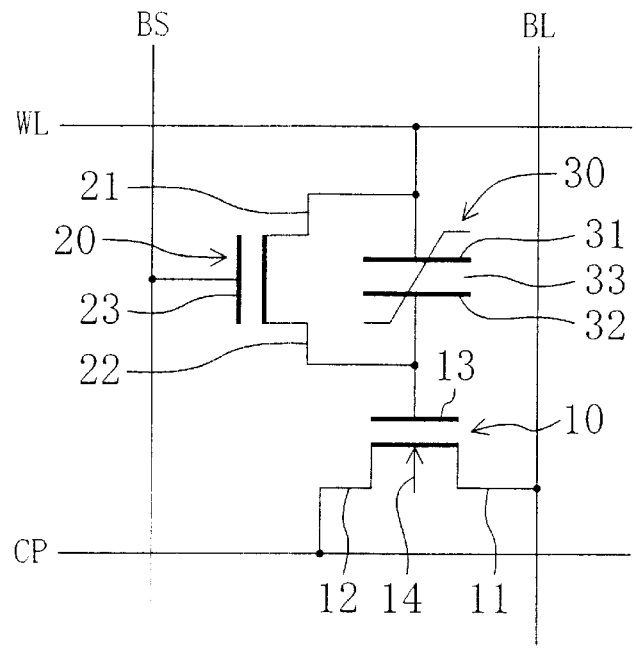
FIG. 1 is an equivalent circuit diagram of a memory cell included in a semiconductor memory according to Embodiment 1 of the invention.

FIG. 1 shows an equivalent circuit of a memory cell included in the semiconductor memory of Embodiment 1. The semiconductor memory of this embodiment includes a reading FET 10 having a drain region 11, a source region 12 and a gate electrode 13, a selecting FET 20 having a drain region 21, a source region 22 and a gate electrode 23, and a ferroelectric capacitor 30 having an upper electrode 31, a lower electrode 32 and a ferroelectric film 33, and the reading FET 10, the selecting FET 20 and the ferroelectric capacitor 30 together form the memory cell.

The lower electrode 32 of the ferroelectric capacitor 30 is connected to the gate electrode 13 of the reading FET 10 and the source region 22 of the selecting FET 20. The upper electrode 31 of the ferroelectric capacitor 30 is connected to the drain region 21 of the selecting FET 20 and a word line WL. The drain region 11 of the reading FET 10 is connected to a bit line BL, the source region 12 of the reading FET 10 is connected to a plate line CP, and the gate electrode 23 of the selecting FET 20 is connected to a control line BS. In FIG. 1, a reference numeral 14 denotes a substrate where the reading FET 10 is formed.

Figure 2:
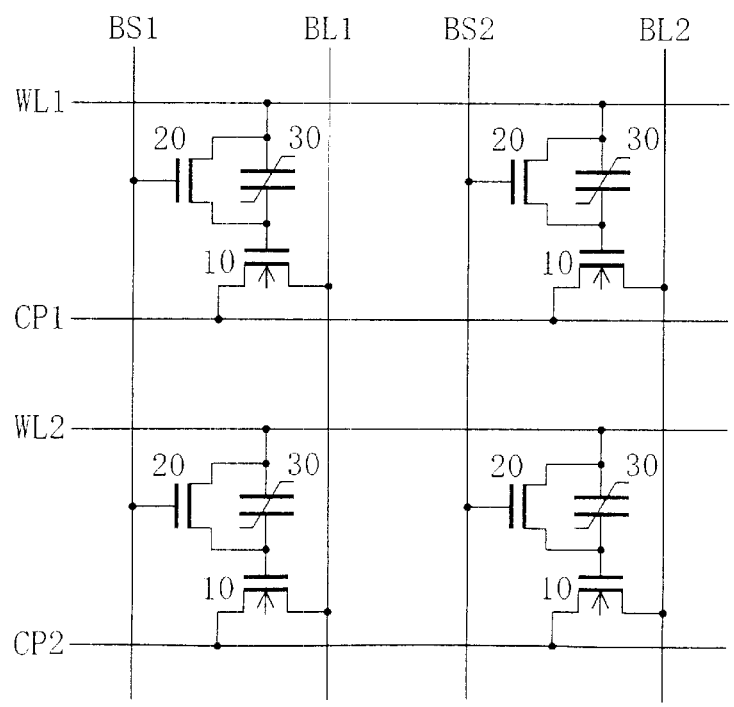
FIG. 2 is an equivalent circuit diagram of a memory cell array in which memory cells each included in the semiconductor memory of Embodiment 1 are arranged in the form of a matrix.

FIG. 2 shows an equivalent circuit of a memory cell array in which a plurality of memory cells of FIG. 1 are arranged in the form of a matrix.

As shown in FIG. 2, the upper electrodes 31 of the ferroelectric capacitors 30 included in the memory cells on the first row are connected to a first word line WL1, and the upper electrodes 31 of the ferroelectric capacitors 30 included in the memory cells on the second row are connected to a second word line WL2. The drain regions 11 of the reading FETs 10 included in the memory cells in the first column are connected to a first bit line BL1, and the drain regions 11 of the reading FETs 10 included in the memory cells in the second column are connected to a second bit line BL2. The source regions 12 of the reading FETs 10 included in the memory cells on the first row are connected to a first plate line CP1, and the source regions 12 of the reading FETs 10 included in the memory cells on the second row are connected to a second plate line CP2. The gate electrodes 23 of the selecting FETs 20 included in the memory cells in the first column are connected to a first control line BS1, and the gate electrodes 23 of the selecting FETs 20 included in the memory cells in the second column are connected to a second control line BS2.

Now, the method for driving the semiconductor memory of Embodiment 1 will be described.
(Data Write Operation)

A write operation of the semiconductor memory of this embodiment is carried out as follows:

With the gate potential of the reading FET 10 and the substrate potential set to a ground voltage, a voltage 0 V is applied to all the signal lines including the word line WL, the bit line BL, the plate line CP and the control line BS. Thereafter, a positive or negative writing voltage is applied to the word line WL, so as to cause downward or upward polarization in the ferroelectric film 33 of the ferroelectric capacitor 30. Herein, a state where downward polarization is caused in the ferroelectric film 33 is defined as a data "1" and a state where upward polarization is caused in the ferroelectric film 33 is defined as a data "0".

Figure 3:
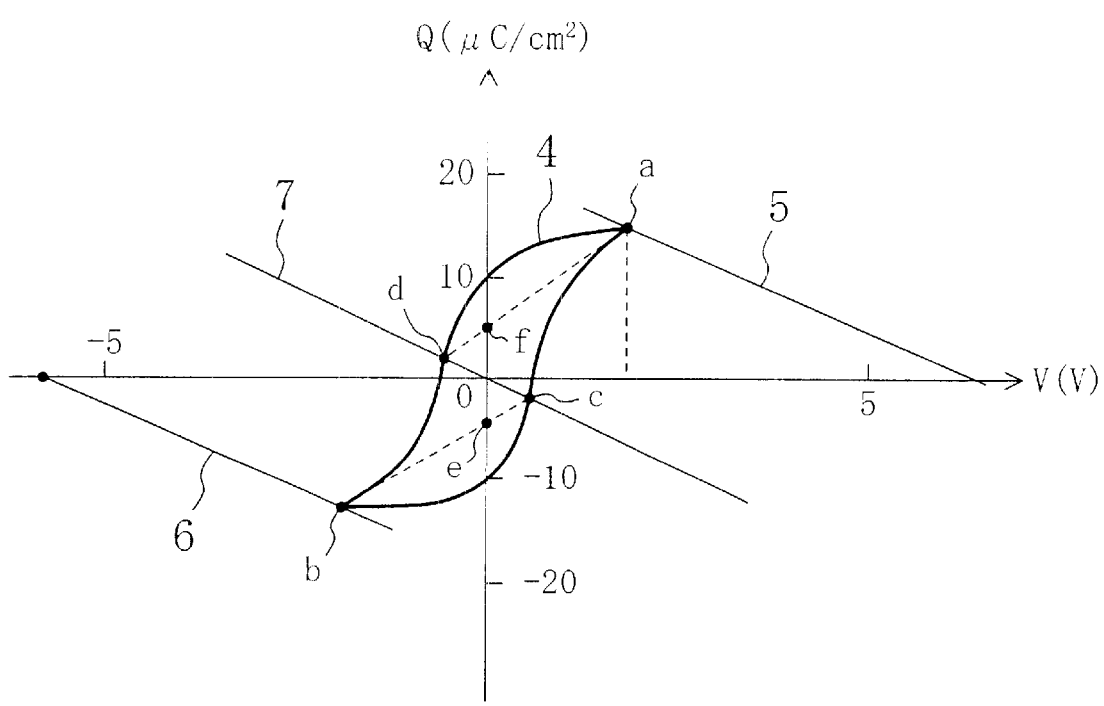
FIG. 3 is a diagram for showing behavior of charge and voltage in a read operation of the semiconductor memory of Embodiment 1.

With reference to FIG. 3, the relationship between charge Q (indicated by the ordinate) and voltage V (indicated by the abscissa) in a write operation will now be described. In FIG. 3, a reference numeral 4 denotes a hysteresis loop obtained in data write, a reference numeral 5 denotes a first gate capacitance load line obtained in writing a data "1", a reference numeral 6 denotes a second gate capacitance load line obtained in writing a data "0", and a reference numeral 7 denotes a third gate capacitance load line obtained when a bias voltage is 0 V.

For example, when the potential of the word line WL is set to 6 V, the magnitude of the polarization of the ferroelectric film 33 of the ferroelectric capacitor 30 corresponds to an upper end point a on the hysteresis loop 4, and when the potential of the word line WL is set to −6 V, the magnitude of the polarization of the ferroelectric film of the ferroelectric capacitor 30 corresponds to a lower end point b on the hysteresis loop 4.

When a write operation is completed, the potential of the word line WL is set to 0 V. Thus, in the case where a data "1" (corresponding to downward polarization) is stored, the potential of the gate electrode 13 of the reading FET 10 corresponds to a first intersection d between the hysteresis loop 4 and the third gate capacitance load line 7, which has a positive potential. In the case where a data "0" (corresponding to upward polarization) is stored, the potential of the gate electrode 13 of the reading FET 10 corresponds to a second intersection c between the hysteresis loop 4 and the third gate capacitance load line 7, which has negative potential.

Under this condition, the potential of the control line BS is increased to exceed the threshold voltage of the selecting FET 20, so as to turn on the selecting FET 20. Thus, the potential of both the upper electrode 31 and the lower electrode 32 of the ferroeletric capacitor 30 become 0 V. Therefore, in the case where a data "1" is stored, the potential of the gate electrode 13 of the reading FET 10 moves from the first intersection d to a first point f on the ordinate, and in the case where a data "0" is stored, the potential of the gate electrode 13 of the reading FET 10 moves from the second intersection c to a second point e on the ordinate.

Thereafter, even when the potential of the control line BS is set to 0 V so as to turn off the selecting FET 20, there is no potential difference between the upper electrode 31 and the lower electrode 32, and hence, the magnitude of the polarization of the ferroelectric film 33 is retained.
(Data Read Operation)

A read operation of the semiconductor memory of this embodiment is carried out as follows:

As described above, the selecting FET 20 is turned on after a write operation, so as to set the potential of both the upper electrode 31 and the lower electrode 32 of the ferroelectric capacitor 30 to 0 V. Therefore, as shown in FIG. 3, in the case where a data "1" is stored, the potential of the gate electrode 13 of the reading FET 10 moves from the first intersection d to the first point f on the ordinate and in the case where a data "0" is stored, the potential of the gate electrode 13 of the reading FET 10 moves from the second intersection c to the second point e on the ordinate.

At this point, a voltage of, for example, 1.5 V is applied to the word line WL of FIG. 1. In this manner, a potential difference of 1.5 V is caused between the word line WL and the substrate 14, and the potential difference is divided in accordance with the capacitance of the ferroelectric capacitor 30 and the gate capacitance of the reading FET 10. The dependency of the capacitance of the ferroelectric capacitor 30 on voltage is varied in accordance with the polarization direction of the ferroelectric film 33, namely, whether the stored data is "1" or "0". This will now be described with reference to FIG. 4.

Figure 4:
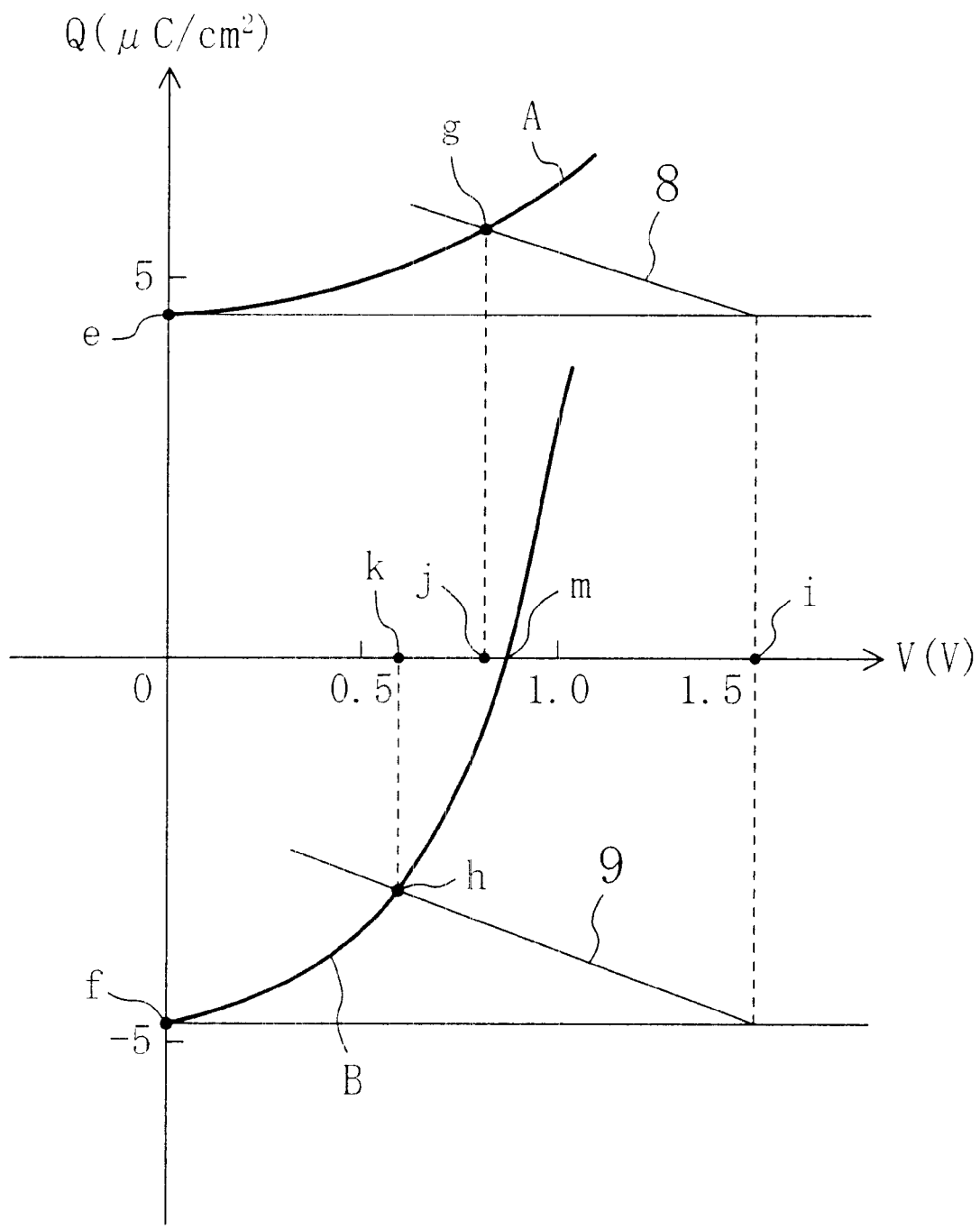
FIG. 4 is a diagram for showing behavior of charge and voltage in a read operation of the semiconductor memory of Embodiment 1.

In assuming a point for keeping the polarization to be the origin and the gate capacitance to be a load line, a state where a voltage of 1.5 V is applied to the word line WL is equivalent to the load line crossing the voltage axis (abscissa) at a point of 1.5 V. This is equivalent to giving a fourth gate capacitance load line 8 with respect to a data "1" and giving a fifth gate capacitance load line 9 with respect to a data "0" as shown in FIG. 4.

When a voltage is applied to the word line WL, a voltage is also applied to the ferroelectric capacitor 30. Therefore, in the case where the word line WL has potential of 1.5 V, the polarization is changed along a first curve A when the data is "1" so as to be balanced at an intersection g between the first curve A and the fourth gate capacitance load line 8, and the polarization is changed along a second curve B when the data is "0" so as to be balanced at an intersection h between the second curve B and the fifth gate capacitance load line 9.

Intersections i, j and k determine the difference in potential in the respective polarized states. When the stored data is "1", a voltage of approximately 0.7 V between the intersection i and the intersection j is distributed as the gate potential of the reading FET 10, and when the stored data is "0", a voltage of approximately 0.9 V between the intersection i and the intersection k is distributed as the gate potential of the reading FET 10.

Accordingly, when the threshold voltage of the reading FET 10 is set to 0.8 V corresponding to an intermediate value between 0.7 V and 0.9 V, the reading FET 10 is in an off-state in reading a data "1" and is in an on-state in reading a data "0".

Therefore, when a potential difference is caused between the plate line CP and the bit line BL of FIG. 1, no current flows through the reading FET 10 when a data "1" is stored and current flows through the reading FET 10 when a data "0" is stored. Accordingly, it can be determined whether the stored data is "1" or "0" by detecting a current flowing through the reading FET 10 with current detection means.

In this read operation, when the stored data is "1", the voltage application to the word line WL enhances the polarization but when the stored data is "0", the voltage application reverses the polarization. Accordingly, when a voltage applied to the ferroelectric capacitor exceeds the coercive voltage thereof, the polarization is reversed. However, in this embodiment, the voltage applied to the ferroelectric capacitor 30 when the stored data is "0" is 0.6 V, which is lower than a point m corresponding to the coercive voltage. Therefore, the polarization is not reversed and there is no fear of change of a stored data.

Preferably, the voltage applied between the word line WL and the substrate 14 is distributed between a voltage applied between the upper electrode 31 and the lower electrode 32 of the ferroelectric capacitor 30 and a voltage applied between the gate electrode 13 of the reading FET 10 and the substrate 14 by adjusting the capacitance of the ferroelectric capacitor 30 and the gate capacitance of the reading FET 10, so that the voltage applied to the ferroelectric capacitor 30 can be set to a value not exceeding the coercive voltage of the ferroelectric capacitor 30, namely, a value for not reversing the polarization.

In this embodiment, the voltage applied to the ferroelectric capacitor 30 in a read operation is set to a value not exceeding the coercive voltage of the ferroelectric capacitor, which does not limit the invention. The voltage applied to the ferroelectric capacitor 30 may have such magnitude that displacement of the polarization of the ferroelectric film 33 is restored to that obtained before reading a data by eliminating the reading voltage applied to the ferroelectric capacitor 30.

In this manner, the polarization of the ferroelectric film 33 is not reversed when a read operation is carried out, and hence, there is no need to carry out an operation for changing the polarization (the polarization reversing operation) of the ferroelectric film 33 after every data read. Accordingly, polarization fatigue is minimally caused in the ferroelectric film of the ferroelectric capacitor, which largely improves the read endurance characteristic of the semiconductor memory.

(Operation After Data Read)

A first method for making a potential difference between the upper electrode 31 and the lower electrode 32 of the ferroelectric capacitor 30 zero after data read will now be described with reference to FIG. 1.

First, the potential of the word line WL is set to 1.5 V so as to read a data stored in the ferroelectric capacitor 30, and then, the potential of the word line WL is lowered to 0 V.

Next, the potential of the control line BS is increased to exceed the threshold voltage of the selecting FET 20, so as to turn on the selecting FET 20. Thus, the upper electrode 31 and the lower electrode 32 of the ferroelectric capacitor 30 are connected to each other through the selecting FET 20, and hence, the potential of both the upper electrode 31 and the lower electrode 32 become 0 V.

The polarization charge of the ferroelectric film 33 obtained after a read operation is substantially equal to the polarization charge obtained before the read operation, and a potential difference between the upper electrode 31 and the lower electrode 32 of the ferroelectric capacitor 30 is zero. Accordingly, lowering of the potential difference through a resistance component of the ferroelectric capacitor 30 disappears. This mechanism will be described in detail in Embodiment 2 with reference to FIG. 9.

A second method for making a potential difference between the upper electrode 31 and the lower electrode 32 of the ferroelectric capacitor 30 zero after data read will now be described with reference to FIG. 5.

Figure 5:
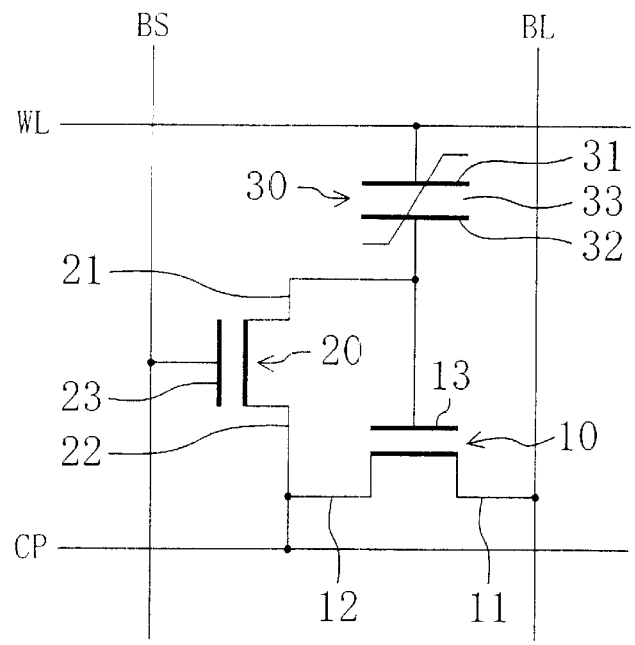
FIG. 5 is an equivalent circuit diagram employed in the semiconductor memory of Embodiment 1 for realizing a second method for making a potential difference between an upper electrode and a lower electrode of a ferroelectric capacitor zero after reading a data.

FIG. 5 shows a circuit for realizing the second method for making a potential difference between the upper electrode 31 and the lower electrode 32 of the ferroelectric capacitor 30 zero. The drain region 21 of the selecting FET 20 is connected between the lower electrode 32 of the ferroelectric capacitor 30 and the gate electrode 13 of the reading FET 10, and the source region 22 of the selecting FET 20 is connected to the plate line CP.

First, the potential of the word line WL is set to 1.5 V so as to read a data stored in the ferroelectric capacitor 30, and then, the potential of the word line WL is lowered to 0 V. Thus, the potential of the upper electrode 31 of the ferroelectric capacitor 30 becomes 0 V.

Next, the potential of the control line BS is increased to exceed the threshold voltage of the selecting FET 20, so as to turn on the selecting FET 20. Thus, the lower electrode 32 of the ferroelectric capacitor 30 and the plate line CP set to 0 V are connected to each other through the selecting FET 20, and hence, the potential of the lower electrode 32 also becomes 0 V.

A third method for making a potential difference between the upper electrode 31 and the lower electrode 32 of the ferroelectric capacitor 30 zero after data read will now be described with reference to FIG. 6.

Figure 6:
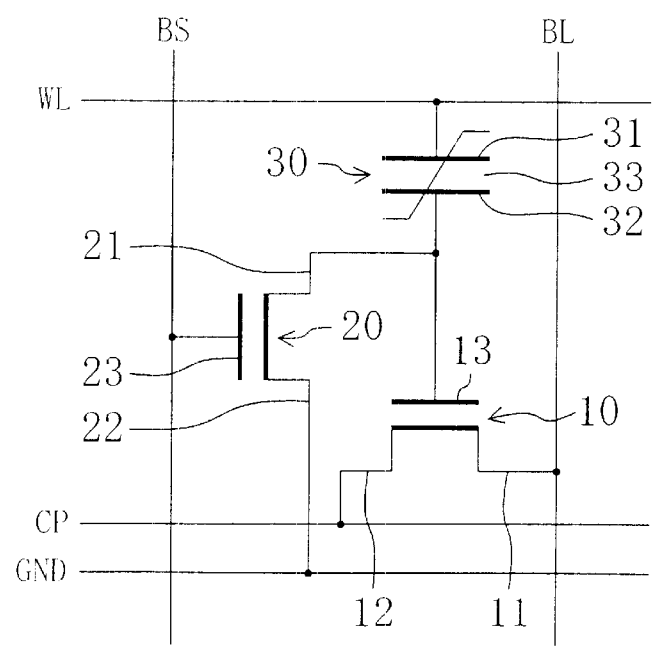
FIG. 6 is an equivalent circuit diagram employed in the semiconductor memory of Embodiment 1 for realizing a third method for making a potential difference between the upper electrode and the lower electrode of the ferroelectric capacitor zero after reading a data.

FIG. 6 shows a circuit for realizing the third method for making a potential difference between the upper electrode 31 and the lower electrode 32 of the ferroelectric capacitor 30 zero. The drain region 21 of the selecting FET 20 is connected between the lower electrode 32 of the ferroelectric capacitor 30 and the gate electrode 13 of the reading FET 10, and the source region 22 of the selecting FET 20 is connected to a ground line GND.

First, the potential of the word line WL is set to 1.5 V so as to read a data stored in the ferroelectric capacitor 30, and then, the potential of the word line WL is lowered to 0 V. Thus, the potential of the upper electrode 31 of the ferroelectric capacitor 30 becomes 0 V.

Next, the potential of the control line BS is increased to exceed the threshold voltage of the selecting FET 20, so as to turn on the selecting FET 20. Thus, the lower electrode 32 of the ferroelectric capacitor 30 and the ground line GND are connected to each other through the selecting FET 20, and hence, the potential of the lower electrode 32 also becomes 0 V.

A fourth method for making a potential difference between the upper electrode 31 and the lower electrode 32 of the ferroelectric capacitor 30 zero after data read will now be described with reference to FIG. 7.

Figure 7:
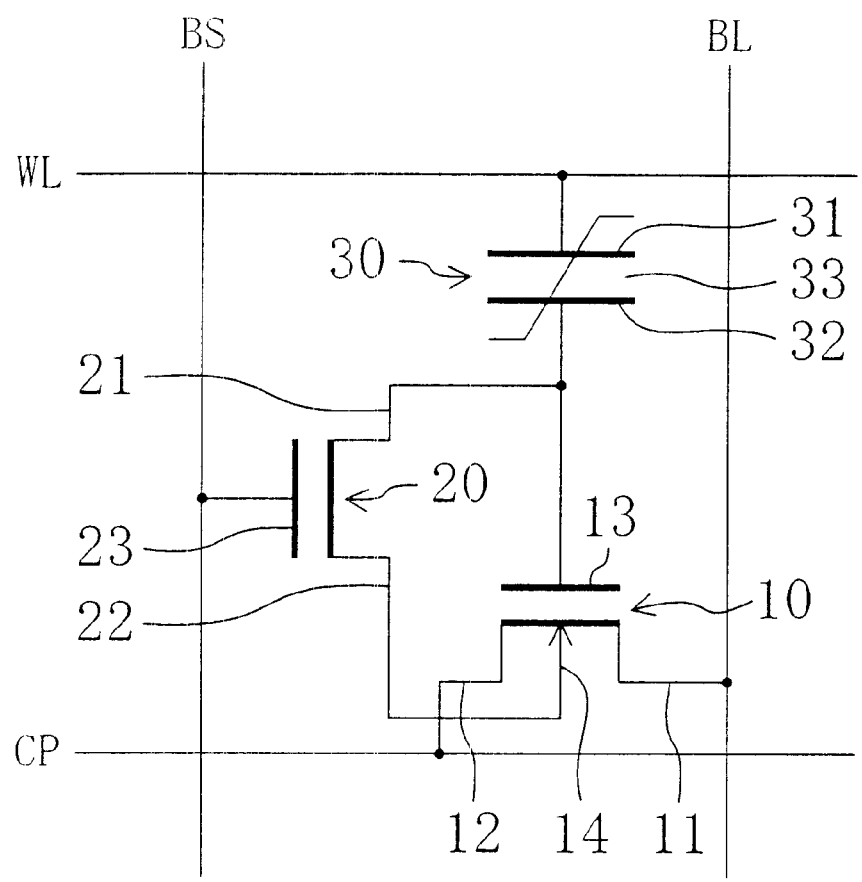
FIG. 7 is an equivalent circuit diagram employed in the semiconductor memory of Embodiment 1 for realizing a fourth method for making a potential difference between the upper electrode and the lower electrode of the ferroelectric capacitor zero after reading a data.

FIG. 7 shows a circuit for realizing the fourth method for making a potential difference between the upper electrode 31 and the lower electrode 32 of the ferroelectric capacitor 30 zero. The drain region 21 of the selecting FET 20 is connected between the lower electrode 32 of the ferroelectric capacitor 30 and the gate electrode 13 of the reading FET 10, and the source region 22 of the selecting FET 20 is connected to the substrate 14 of the reading FET 10.

First, the potential of the word line WL is set to 1.5 V so as to read a data stored in the ferroelectric capacitor 30, and then, the potential of the word line WL is lowered to 0 V. Thus, the potential of the upper electrode 31 of the ferroelectric capacitor 30 becomes 0 V.

Next, the potential of the control line BS is increased to exceed the threshold voltage of the selecting FET 20, so as to turn on the selecting FET 20. Thus, the lower electrode 32 of the ferroelectric capacitor 30 and the substrate 14 of the reading FET 10 set to 0 V are connected to each other through the selecting FET 20, and hence, the potential of the lower electrode 32 also becomes 0 V.

Embodiment 2

A semiconductor memory and a method for driving the semiconductor memory according to Embodiment 2 of the invention will now be described with reference to FIGS. 8, 9, 10A and 10B.

Figure 8:
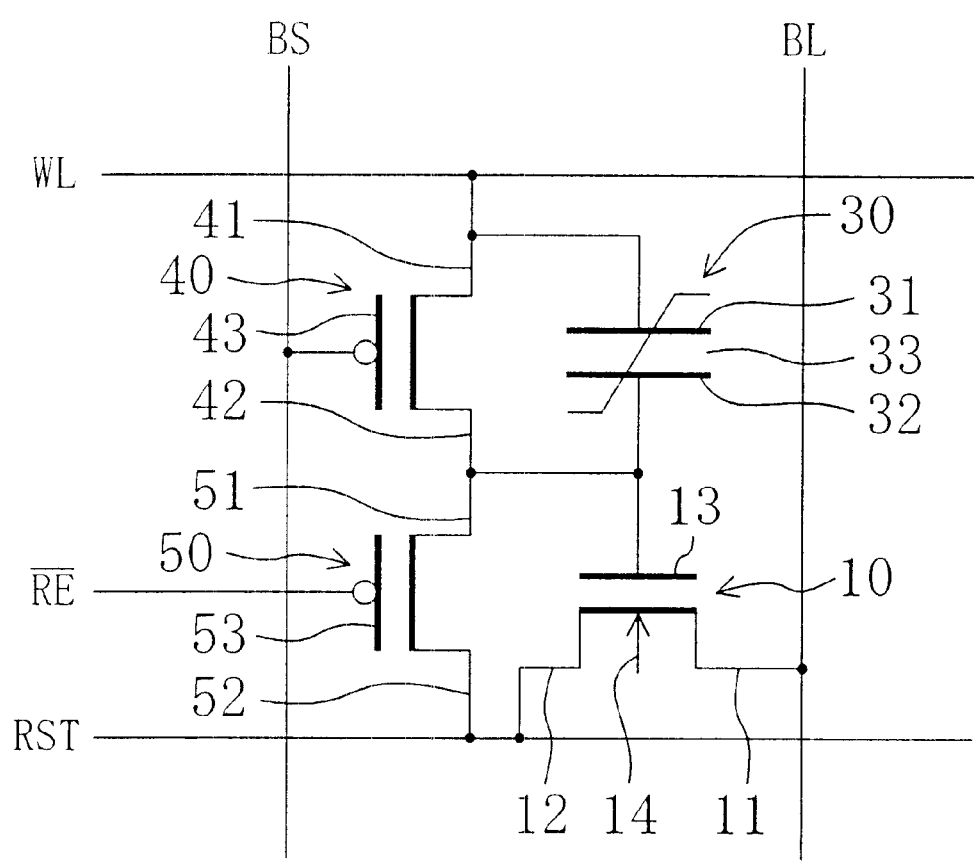
FIG. 8 is an equivalent circuit diagram of a memory cell included in a semiconductor memory according to Embodiment 2 of the invention.

FIG. 8 shows an equivalent circuit of a memory cell included in the semiconductor memory of Embodiment 2. The semiconductor memory of Embodiment 2 includes a reading FET (N-channel transistor) 10 having a drain region 11, a source region 12 and a gate electrode 13, a ferroelectric capacitor 30 having an upper electrode 31, a lower electrode 32 and a ferroelectric film 30, a first selecting FET (P-channel transistor) 40 having a drain region 41, a source region 42 and a gate electrode 43, and a second selecting FET (P-channel transistor) 50 having a drain region 51, a source region 52 and a gate electrode 53.

The upper electrode 31 of the ferroelectric capacitor 30 is connected to the drain region 41 of the first selecting FET 40 and a word line WL, and the lower electrode 32 of the ferroelectric capacitor 30 is connected to the gate electrode 13 of the reading FET 10, the source region 42 of the first selecting FET 40 and the drain region 51 of the second selecting FET 50. The drain region 11 of the reading FET 10 is connected to a bit line BL, and the source region 12 of the reading FET 10 is connected to the source region 52 of the second selecting FET 50 and a reset line RST. The gate electrode 43 of the first selecting FET 40 is connected to a cell selecting line BS, and the gate electrode 53 of the second selecting FET 50 is connected to a read cell selecting line /RE. Accordingly, the gate electrode 13 of the reading FET 10 is connected to the reset line RST through the second selecting FET 50.

Now, the method for driving the semiconductor memory of this embodiment will be described.

In the semiconductor memory of Embodiment 2, the read cell selecting line /RE is always set to an L level (of, for example, 0 V) except in a read operation, and the second selecting FET 50 is always in an on-state except in a read operation. Therefore, merely in a read operation, charge flows from the ferroelectric capacitor 30 to the gate electrode 13 of the reading FET 10. Also, in operations other than a read operation, the second selecting FET 50 connects the word line WL to the reset line RST through the first selecting FET 40 as preparation for a write operation and an erase operation.

(Data Write Operation)

In conducting a data write operation, the first selecting FET 40 is first turned off by setting the cell selecting line BS to an H level (of, for example, 5 V), so as to connect the upper electrode 31 of the ferroelectric capacitor 30 to the word line WL and to connect the lower electrode 32 of the ferroelectric capacitor 30 to the reset line RST through the second selecting FET 50.

Thereafter, with the potential of the reset line RST kept at an L level (of, for example, 0 V), the potential of the word line WL is set to an H level so as to cause a positive potential difference between the upper electrode 31 and the lower electrode 32 of the ferroelectric capacitor 30. Thus, downward polarization is caused in the ferroelectric film 33 for storing a data "1".

Then, the potential of the word line WL is set to an L level, so as to make the potential difference between the upper electrode 31 and the lower electrode 32 of the ferroelectric capacitor 30 zero.

(Data Erase Operation)

In conducting a data erase operation, the first selecting FET 40 is turned off by setting the cell selecting line BS to an H level, so as to connect the upper electrode 31 of the ferroelectric capacitor 30 to the word line WL and to connect the lower electrode 32 of the ferroelectric capacitor 30 to the reset line RST through the second selecting FET 50.

Thereafter, with the potential of the word line WL kept at an L level, the potential of the reset line RST is increased to an H level, so as to cause a negative potential difference between the upper electrode 31 and the lower electrode 32 of the ferroelectric capacitor 30. Thus, upward polarization is caused in the ferroelectric film 33 for resetting the stored data to "0".

(Data Read Operation)

In conducting a data read operation, the first selecting FET 40 is turned off by setting the potential of the cell selecting line BS to an H level. Then, the second selecting FET 50 is turned off by setting the potential of the read cell selecting line /RS to an H level, the potential the bit line BL is set to an H level and the potential of the reset line RST is set to an L level. In this manner, a potential difference is caused between the drain region 11 and the source region 12 of the reading FET 10, and voltage change on the bit line BL obtained by applying a positive reading voltage $V_{RD}$ to the word line WL is detected by a sense amplifier (not shown) connected to the bit line BL. Thus, a data stored in the ferroelectric capacitor 30 is read.

The capacitance of the ferroelectric capacitor 30 and the gate capacitance of the reading FET 10 are set so that a relationship of $V_R > V_T > V_S$ can hold among the threshold voltage $V_T$ of the reading FET 10, a voltage $V_S$ applied to the gate electrode 13 of the reading FET 10 when the ferroelectric capacitor 30 stores a data "1", and a voltage $V_R$ applied to the gate electrode 13 of the reading FET 10 when the ferroelectric capacitor 30 stores a data "0".

Now, read operations respectively conducted when the ferroelectric capacitor 30 stores a data "1" and when it stores a data "0" will be described with reference to FIGS. 8 and 9.

Figure 9:
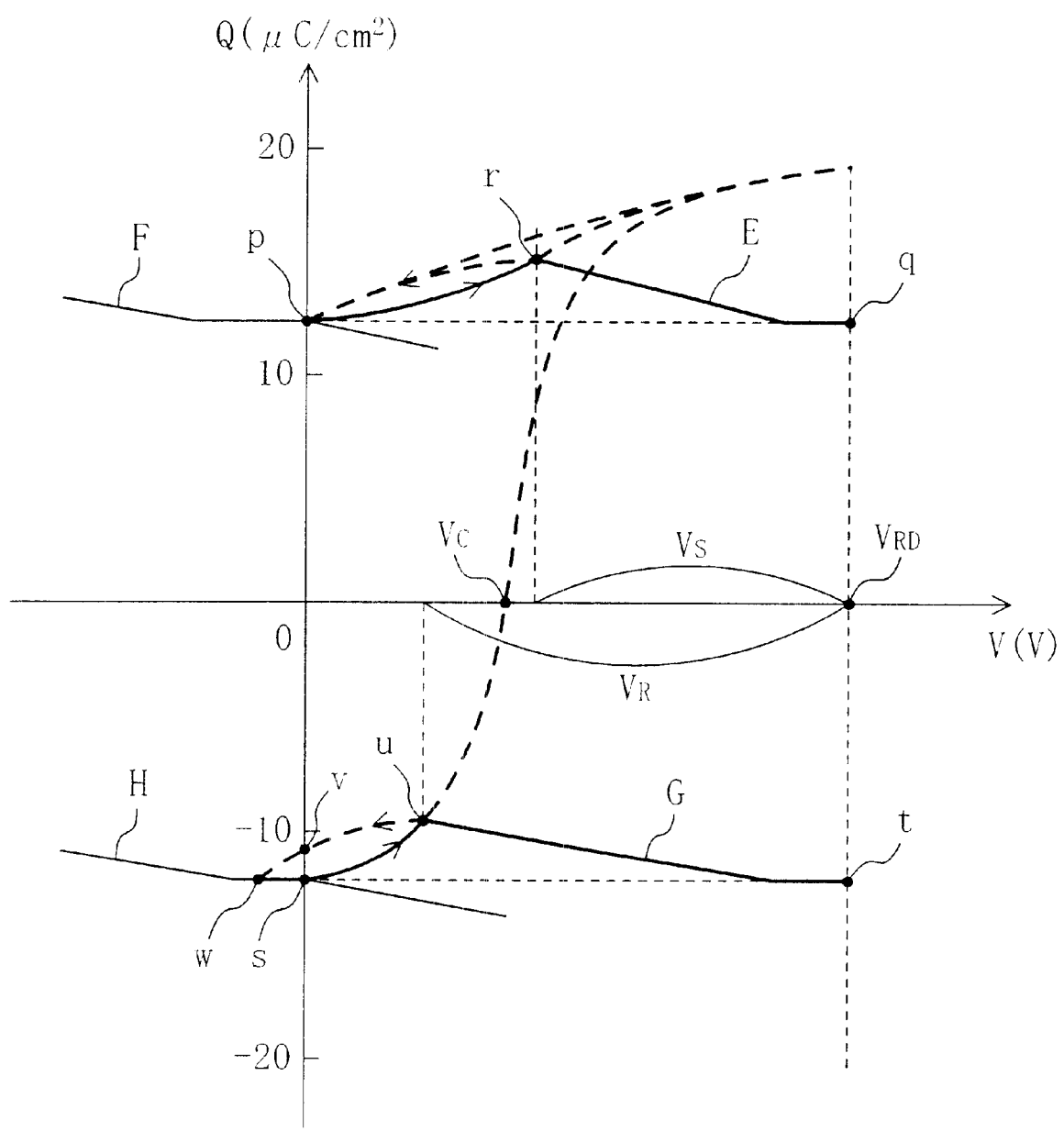
FIG. 9 is a diagram for showing behavior of charge and voltage in a read operation of the semiconductor memory of Embodiment 2.

In FIG. 9, the ordinate indicates charge Q of polarization kept in the ferroelectric film 33 of the ferroelectric capacitor 30, and the abscissa indicates voltage applied to a series circuit. Also in FIG. 9, E denotes a gate capacitance load line of the reading FET 10 obtained by applying the reading voltage $V_{RD}$ to the word line WL when a data "1" is stored, F denotes a gate capacitance load line of the reading FET 10 obtained by applying a reading voltage of 0 V to the word line WL when a data "1" is stored, G denotes a gate capacitance load line of the reading FET 10 obtained by applying the reading voltage $V_{RD}$ to the word line WL when a data "0" is stored, and H denotes a gate capacitance load line of the reading FET 10 obtained by applying a reading voltage of 0 V to the word line WL when a data "0" is stored.

First, the potential of the substrate 14 where the reading FET 10 is formed is set to an L level.

Next, in accordance with the aforementioned procedures of a read operation, the upper electrode 31 of the ferroelectric capacitor 30 is connected to the word line WL and the lower electrode 32 of the ferroelectric capacitor 30 is connected to the reset line RST. Thereafter, the second selecting FET 50 is turned off by setting the potential of the read cell selecting line /RE to an H level, the potential of the bit line BL is set to an H level and the potential of the reset line RST is set to an L level.

Under this condition, when the positive reading voltage $V_{RD}$ is applied to the word line WL, the reading voltage $V_{RD}$ is applied to a series circuit composed of the ferroelectric capacitor 30 and the reading FET 10 and present between the word line WL and the substrate 14 of the reading FET 10 (hereinafter simply referred to as the series circuit).

<In Case Where Data "1" Is Stored>

In the case where the ferroelectric capacitor 30 stores a data "1", the polarization charge kept in the ferroelectric film 33 is positioned on a point p. Thereafter, when the reading voltage $V_{RD}$ is applied to the series circuit, the reading voltage $V_{RD}$ is divided between a potential difference $V_S$ caused between the gate electrode 13 of the reading FET 10 and the substrate 14 (namely, a potential difference between points q and r) and a potential difference $V_{RD}-V_S$ caused between the upper electrode 31 and the lower electrode 32 of the ferroelectric capacitor 30 (namely, a potential difference between the points r and p).

The position of the point r, namely, the potential difference $V_S$, depends upon the gate capacitance of the reading FET 10, and the channel conductance of the reading FET 10 in reading a data "1" is determined in accordance with the potential difference $V_S$.

Accordingly, when a ratio between the capacitance of the ferroelectric capacitor 30 and the gate capacitance of the reading FET 10 (a capacitance ratio) is set so that a relationship of $V_T > V_S$ can hold between the threshold voltage $V_T$ of the reading FET 10 and the potential difference $V_S$, a current flowing from the bit line BL set to an H level to the reset line RST through the channel region of the reading FET 10 is comparatively small. Therefore, potential drop on the bit line BL is small.

The potential drop on the bit line BL is detected by a sense amplifier connected to the bit line BL, and the detected value is compared with a previously determined reference value. When the detected value is not smaller than the reference value, it is determined that a data "1" is stored.

<In Case Where Data "0" Is Stored>

In the case where the ferroelectric capacitor 30 stores a data "0", the polarization charge kept in the ferroelectric film 33 is positioned on a point s. Thereafter, when the reading voltage $V_{RD}$ is applied to the series circuit, the reading voltage $V_{RD}$ is divided between a potential difference $V_R$ caused between the gate electrode 13 of the reading FET 10 and the substrate 14 (namely, a potential difference between points t and u) and a potential difference $V_{RD}-V_R$ caused between the upper electrode 31 and the lower electrode 32 of the ferroelectric capacitor 30 (namely, a potential difference between the points u and s).

The position of the point u, namely, the potential difference $V_R$, depends upon the gate capacitance of the reading FET 10, and the channel conductance of the reading FET 10 in reading a data "0" is determined in accordance with the potential difference $V_R$.

Accordingly, when the ratio between the capacitance of the ferroelectric capacitor 30 and the gate capacitance of the reading FET 10 (the capacitance ratio) is set so that a relationship of $V_R > V_T$ can hold between the threshold voltage $V_T$ of the reading FET 10 and the potential difference $V_R$, a current flowing from the bit line BL set to an H level to the reset line RST through the channel region of the reading FET 10 is comparatively large. Therefore, the potential drop on the bit line BL is large.

The potential drop on the bit line BL is detected by the sense amplifier connected to the bit line BL, and the detected value is compared with the previously determined reference value. When the detected value is smaller than the reference value, it is determined that a data "0" is stored.

In this manner, the voltage $V_S$ or $V_R$ applied to the gate electrode 13 of the reading FET 10 in reading a data "1" or a data "0" is determined depending upon the reading voltage $V_{RD}$ applied to the word line WL, the capacitance of the ferroelectric capacitor 30 and the gate capacitance of the reading FET 10.

In general, the gate capacitance of the reading FET 10 may be smaller than the capacitance of the ferroelectric capacitor 30 so as to select a capacitance ratio of, for example, 1:4.

Therefore, a voltage corresponding to merely ⅕ of the reading voltage $V_{RD}$ is applied to the ferroelectric capacitor 30 in a read operation.

When the capacitance ratio is 1:4 and the reading voltage $V_{RD}$ is 2.5 V, a voltage applied to the ferroelectric capacitor 30 is merely approximately 0.5 V, which is lower than a voltage necessary for reversing polarization of the ferroelectric film 33 (namely, the coercive voltage) of the ferroelectric capacitor 30. Accordingly, even when a data "0" is stored, namely, even when the reading voltage is applied in a direction for reversing the polarization of the ferroelectric film 33, the polarization of the ferroelectric film 33 is not reversed, so that fatigue of the ferroelectric film 33 through the polarization reverse can be avoided.

In this manner, if the reading voltage $V_{RD}$ applied to the word line WL, the capacitance of the ferroelectric capacitor 30 and the gate capacitance of the reading FET 10 are appropriately selected, even when the reading voltage is applied in a direction for reversing the polarization of the ferroelectric film 33 (namely, even when a data "0" is stored), the polarization is never reversed but the absolute value of the polarization charge is definitely reduced correspondingly to a potential difference between the points s and u.

Therefore, at the ultimate stage of a read operation of this embodiment, the potential of the word line WL is lowered from an H level to an L level and the second selecting FET 50 is turned on by setting the read cell selecting line /RE to an H level. Thus, a potential difference between the upper electrode 31 and the lower electrode 32 of the ferroelectric capacitor 30 is made zero.

When the second selecting FET 50 is turned on by setting the read cell selecting line /RE to an H level before lowering the potential of the word line WL from an H level to an L level, the polarization charge of the ferroelectric film 33 of the ferroelectric capacitor 30 is changed along the inside region of a saturation hysteresis loop to reach a point v when the ultimate stage of the read operation is completed. Accordingly, the polarization charge obtained after data read is obviously smaller than the polarization charge obtained before the data read.

When a data read operation by this driving method is repeated, the absolute value of the polarization charge obtained in reading a data "0" is gradually reduced to approximate to zero.

Therefore, in this embodiment, before making the potential difference between the upper electrode 31 and the lower electrode 32 of the ferroelectric capacitor 30 zero by turning on the second selecting FET 50, the potential of the word line WL is forcedly set to an L level.

In this manner, although the polarization charge of the ferroelectric film 33 of the ferroelectric capacitor 30 is changed along the inside region of the saturation hysteresis loop, the gate capacitance load line H of the reading FET 10 obtained when the reading voltage applied to the word line WL is 0 V affects the ferroelectric capacitor 30 so that the polarization charge of the ferroelectric film 33 can cross the ordinate at the point s. Specifically, a voltage in a reverse direction to the voltage applied in data read (corresponding to a potential difference between the points v and w) is applied to the ferroelectric capacitor 30. Therefore, the polarization charge rapidly moves through the points u and v to the point w.

The gradient of the gate capacitance load line (namely, the gate capacitance) of the reading FET 10 is sufficiently smaller than (and is approximately ¼ of) the capacitance of the ferroelectric capacitor 30, and therefore, the polarization charge on the point w is substantially equal to the polarization charge on the point s.

Therefore, even when the potential difference between the upper electrode 31 and the lower electrode 32 of the ferroelectric capacitor 30 is made 0 V by turning on the second selecting FET 50 by setting the potential of the read cell selecting line /RE to an L level, the magnitude of the polarization charge of the ferroelectric film 33 of the ferroelectric capacitor 30 storing a data "0" is minimally different from the magnitude of the polarization charge obtained before the data read.

Figure 10A:
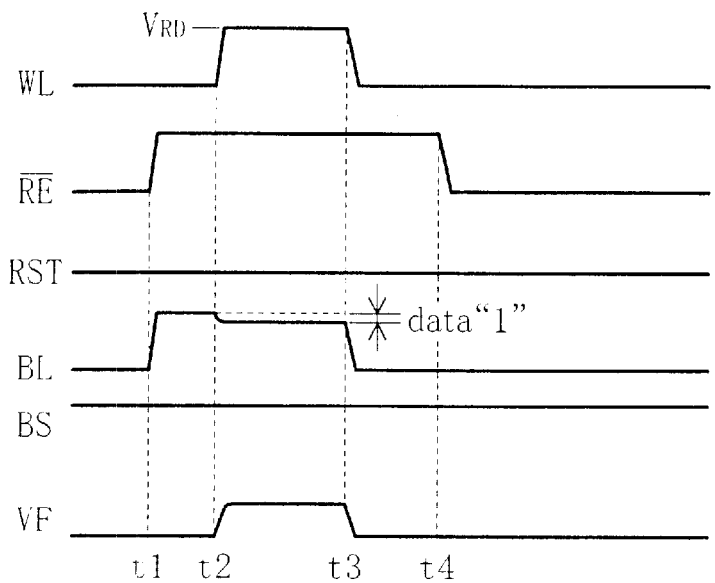
Figure 10B:
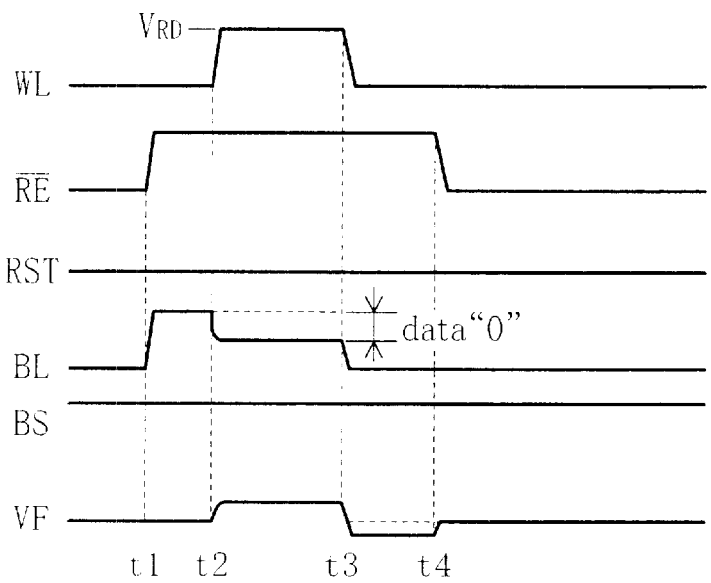

Now, timing in a read operation will be described with reference to FIGS. 10A and 10B. FIG. 10A shows a timing chart employed when a data "1" is stored and FIG. 10B shows a timing chart employed when a data "0" is stored.

<In Case Where Data "1" Is Stored>

First, at time t1, the potential of the read cell selecting line /RE is set to an H level so as to turn off the second selecting FET 50, and the potential of the bit line BL is set to an H level. Also, the potential of the reset line RST is kept at an L level.

Next, at time t2, when the potential of the word line WL is set to the reading voltage $V_{RD}$, the reading voltage $V_{RD}$ is applied to the series circuit present between the word line WL and the substrate 14 of the reading FET 10. At this point, a relationship of $V_F=V_{RD}-V_S$ holds wherein $V_F$ indicates a voltage distributed to the ferroelectric capacitor 30 and $V_S$ indicates a voltage distributed to the reading FET 10.

Since the ratio between the capacitance of the ferroelectric capacitor 30 and the gate capacitance of the reading FET 10 (the capacitance ratio) is set so that the relationship of $V_T>V_S$ holds between the threshold voltage $V_T$ of the reading FET 10 and the voltage $V_S$ distributed to the reading FET 10, a current flowing from the bit line BL set to an H level to the reset line RST through the channel region of the reading FET 10 is comparatively small. Therefore, the voltage drop on the bit line BL is small.

The voltage drop on the bit line BL is detected by the sense amplifier connected to the bit line BL, so as to compare the detected value with the previously set reference value. When the detected value is not smaller than the reference value, it is determined that a data "1" is stored.

Next, at time t3, when the potential of the word line WL is lowered to an L level, the voltage $V_F$ distributed to the ferroelectric capacitor 30 becomes zero.

Therefore, even when the potential of the read cell selecting line /RE is lowered to an L level at time t4, the voltage $V_F$ distributed to the ferroelectric capacitor 30 remains zero, and hence, no change is caused in the polarization of the ferroelectric film 33 of the ferroelectric capacitor 30.

<In Case Where Data "0" Is Stored>

First, at time t1, the potential of the read cell selecting line /RE is set to an H level so as to turn off the second selecting FET 50, and the potential of the bit line BL is set to an H level. Also, the potential of the reset line RST is kept at an L level.

Next, at time t2, when the reading voltage $V_{RD}$ is applied to the word line WL, the reading voltage $V_{RD}$ is applied to the series circuit present between the word line WL and the substrate 14 of the reading FET 10. At this point, a relationship of $V_F=V_{RD}-V_R$ holds wherein $V_F$ indicates the voltage distributed to the ferroelectric capacitor 30 and $V_R$ indicates the voltage distributed to the reading FET 10.

Since the ratio between the capacitance of the ferroelectric capacitor 30 and the gate capacitance of the reading FET 10 (the capacitance ratio) is set so that the relationship of $V_R>V_T$ can hold between the threshold voltage $V_T$ of the reading FET 10 and the voltage $V_R$ distributed to the reading FET 10, a current flowing from the bit line BL set to an H level to the reset line RST through the channel region of the reading FET 10 is comparatively large. Therefore, the voltage drop on the bit line BL is large.

The voltage drop on the bit line BL is detected by the sense amplifier connected to the bit line BL, so as to compare the detected value with the previously set reference value. When the detected value is smaller than the reference value, it is determined that a data "0" is stored.

Next, at time t3, the potential of the word line WL is forcedly returned to an L level, so as to apply a voltage with polarity reverse to that of the reading voltage $V_{RD}$ between the upper electrode 31 and the lower electrode 32 of the ferroelectric capacitor 30.

Then, at time t4, the potential of the read cell selecting line /RE is set to an L level, so as to make a voltage applied to the ferroelectric capacitor 30 zero.

In this manner, in a time period between time t3 and time t4, polarization corresponding to a data "0" is rewritten in the ferroelectric film 33 of the ferroelectric capacitor 30.

Accordingly, the magnitude of the polarization of the ferroelectric film 33 of the ferroelectric capacitor 30 corresponding to a data "0" is not changed between before and after a read operation. As a result, a data "0" can be stably repeatedly read out.

Now, the results of a test carried out for evaluating Embodiment 2 will be described with reference to FIGS. 11, 12 and 13.

Figure 11:
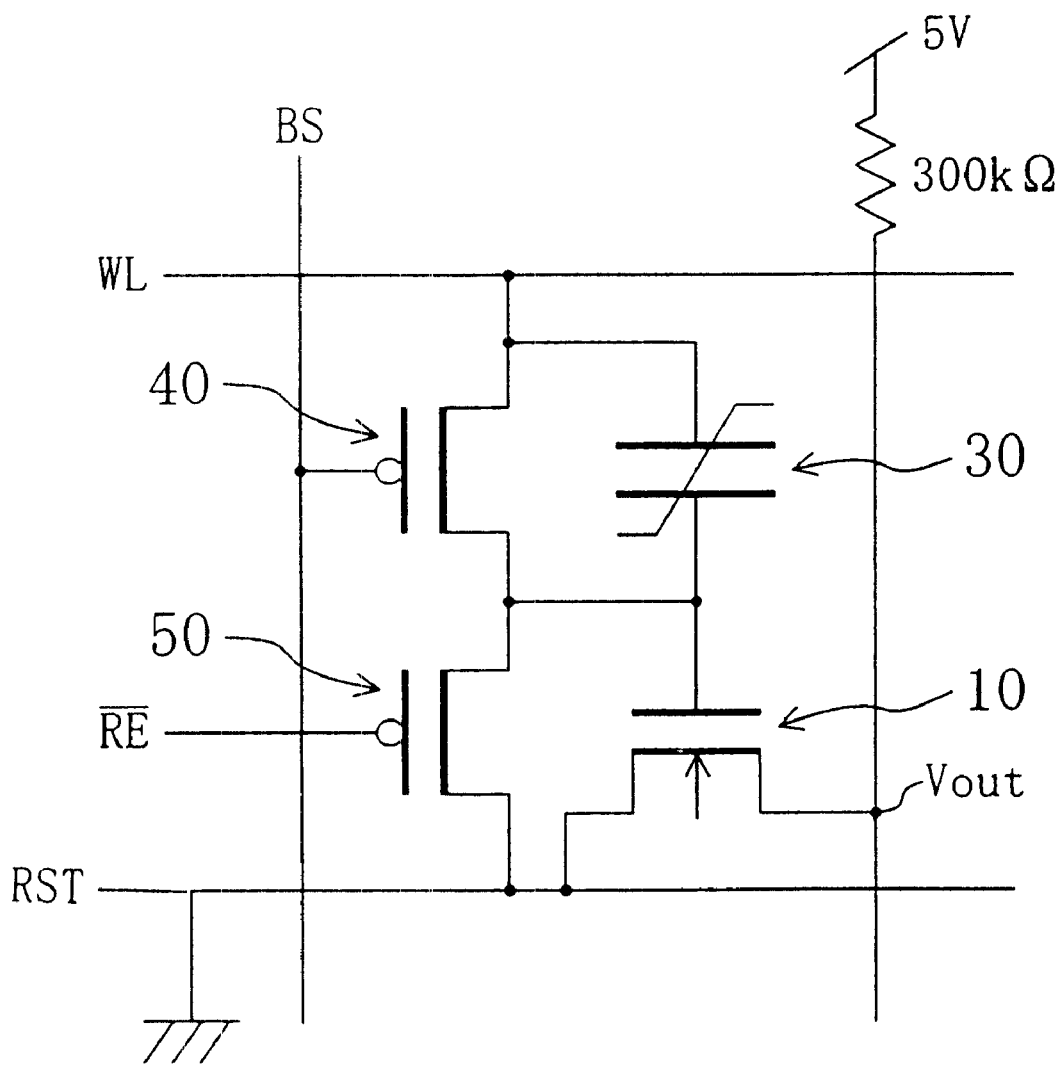
FIG. 11 is an equivalent circuit diagram for explaining an evaluation test for the semiconductor memory of Embodiment 2.

The evaluation test is carried out by detecting a voltage $V_{out}$ of the drain region of the reading FET 10 with a voltage of 5 V applied to the bit line BL connected to a resistance of 300 kΩ and with the reset line RST grounded as shown in FIG. 11.

Figure 12:
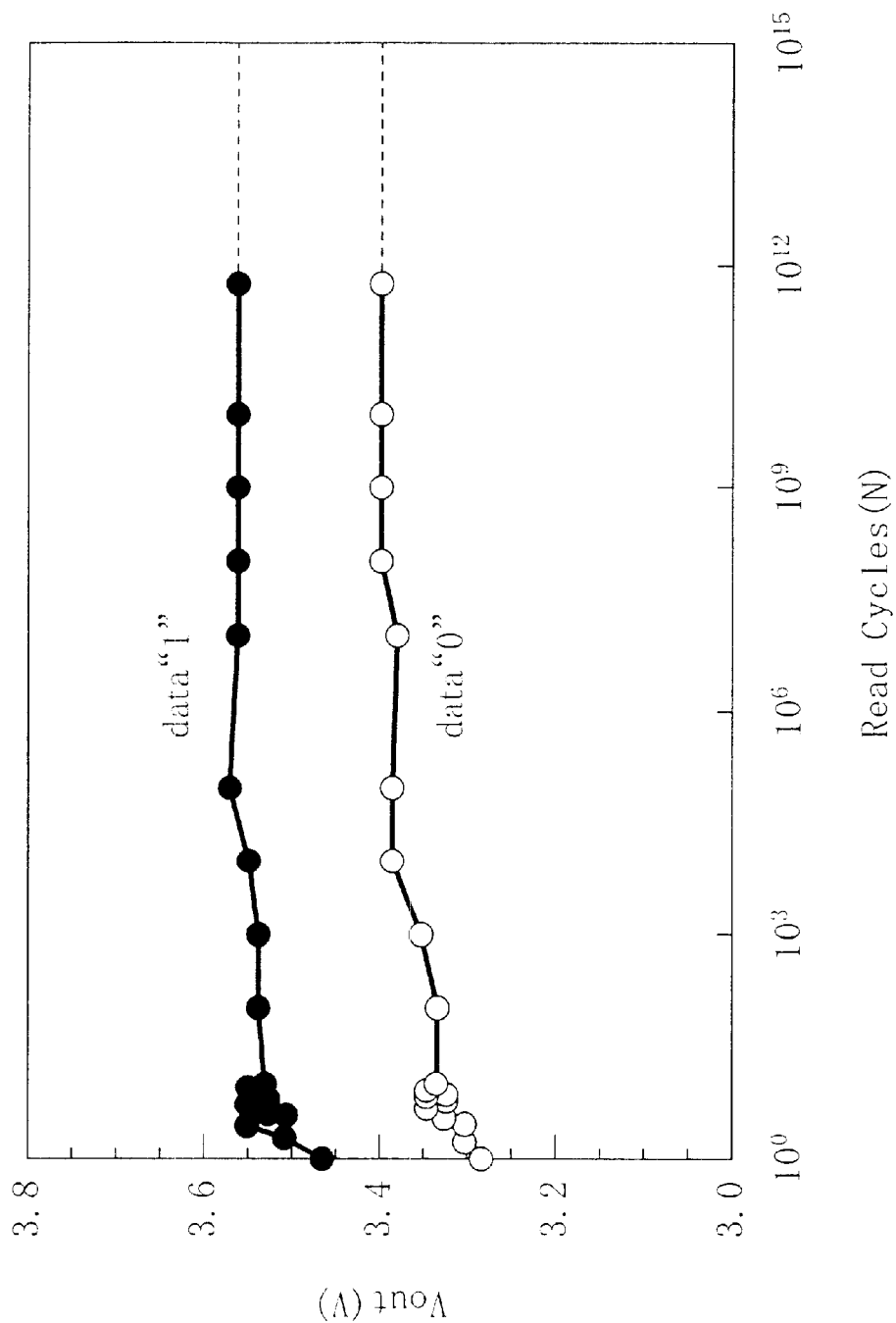
FIG. 12 is a diagram for showing the relationship between the number of read cycles and voltage resulting from the evaluation test for the semiconductor memory of Embodiment 2.

FIG. 12 shows the relationship between the number of read cycles (N) and the voltage $V_{out}$. In both of the cases where a data "1" is stored and where a data "0" is stored, the voltage $V_{out}$ is not lowered when the number of read cycles is at least $10^{12}$.

Figure 13:
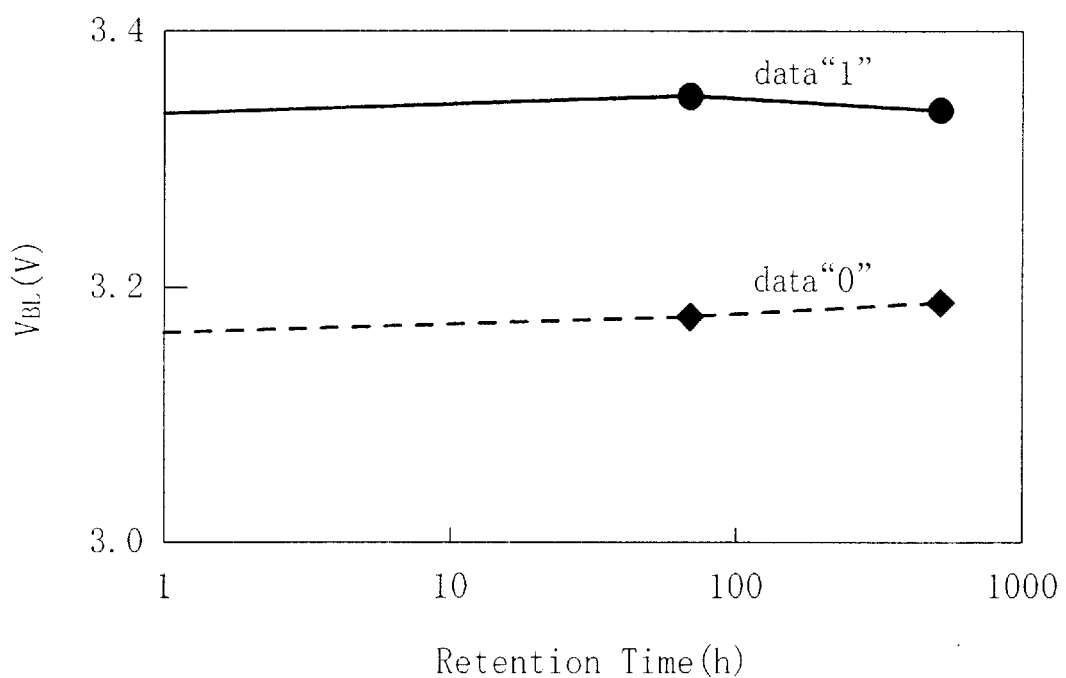
FIG. 13 is a diagram for showing the relationship between retention time and bit line voltage resulting from the evaluation test for the semiconductor memory of Embodiment 2.

FIG. 13 shows the relationship between the retention time (h) and the voltage $V_{out}$. In both of the cases where a data "1" is stored and where a data "0" is stored, the voltage $V_{out}$ is not lowered even when the retention time approximates to 1000 hours.

The reading FET 10 is an N-channel MOS transistor and the first and second selecting FETs 40 and 50 are P-channel MOS transistors in Embodiment 2. Instead, the reading FET 10 may be a P-channel MOS transistor with N-channel transistors used as the first and second selecting FETs 40 and 50. Alternatively, the reading FET 10 and the first and second selecting FETs 40 and 50 may have the same channel type with the well region of the reading FET 10 having a different conductivity type from the well regions of the first and second selecting FETs 40 and 50.

Embodiment 3

A semiconductor memory and a method for driving the semiconductor memory according to Embodiment 3 of the invention will now be described with reference to FIG. 14.

Figure 14:
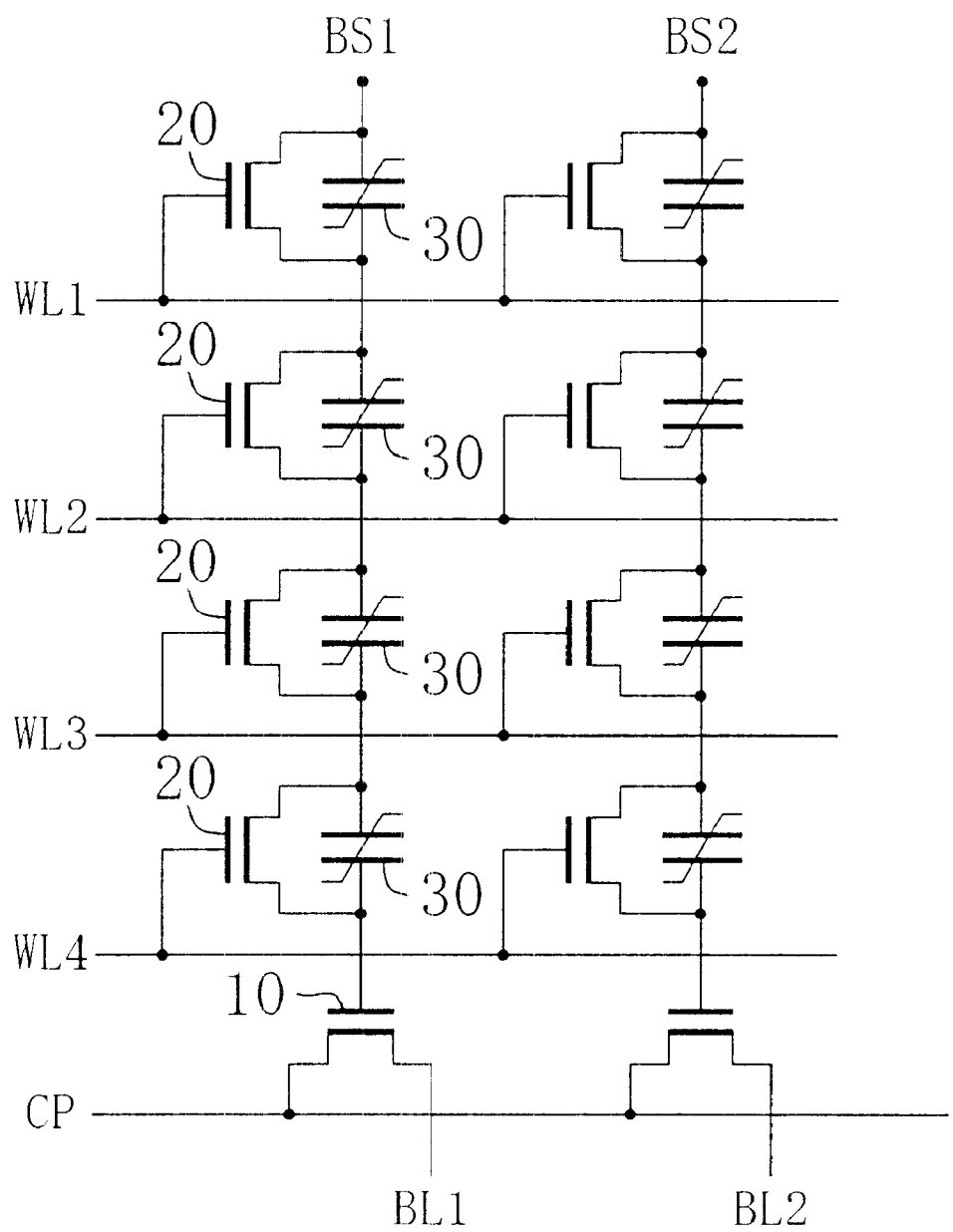
FIG. 14 is an equivalent circuit diagram of a memory cell array of a semiconductor memory according to Embodiment 3 of the invention.
Figure 15:
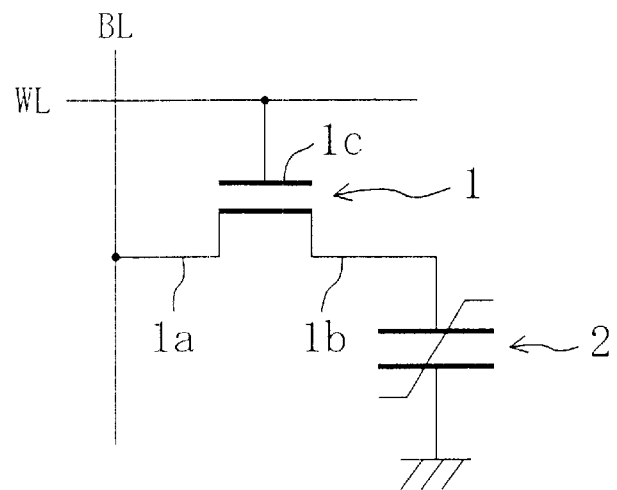
FIG. 15 is an equivalent circuit diagram of a memory cell included in a semiconductor memory according to a first conventional example.
Figure 16:
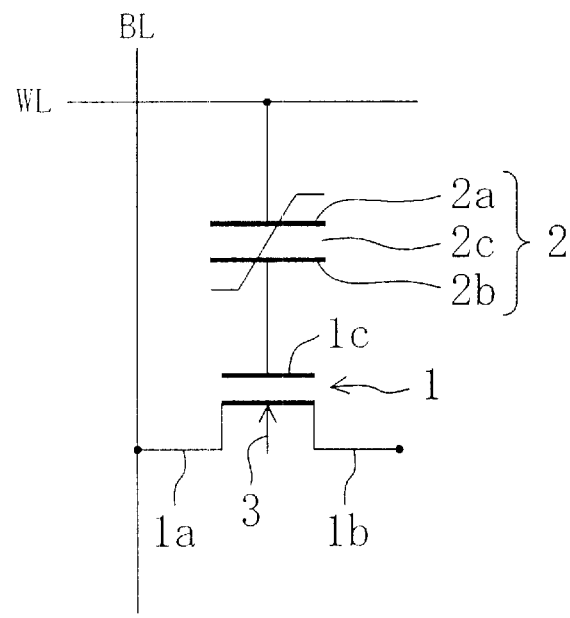
FIG. 16 is an equivalent circuit diagram of a memory cell included in a semiconductor memory according to a second conventional example.

As shown in FIG. 14, similarly to Embodiment 1, a plurality of memory cells each including a ferroelectric capacitor 30 and a selecting FET 20 connected to each other in parallel are serially connected to one another, and a reading FET 10 is connected to one end of each bit column including the plural serially connected ferroelectric capacitors 30. Also, a plurality of bit column each including the plural ferroelectric capacitors 30 are provided along the row direction, so as to form a memory cell array.

The reading FET 10, the selecting FET 20 and the ferroelectric capacitor 30 of Embodiment 3 have the same structures as those of Embodiment 1.

As shown in FIG. 14, a first word line WL1 is connected to the gate electrode of the selecting FET 20 included in each memory cell on the first row, a second word line WL2 is connected to the gate electrode of the selecting FET 20 included in each memory cell on the second row, and a third word line WL3 and a fourth word line WL4 are similarly connected.

The first bit column including the plural ferroelectric capacitors 30 is connected to a first control line BS1 at one end thereof and to the gate electrode of the reading FET 10 at the other end thereof, and the drain region of the reading FET 10 is connected to a first bit line BL1. Also, the second bit column including the plural ferroelectric capacitors 30 is connected to a second control line BS2 at one end thereof and to the gate electrode of the reading FET 10 at the other end thereof, and the drain region of the reading FET 10 is connected to a second bit line BL2. Furthermore, the source regions of the reading FETs 10 of the first and second columns are commonly connected to a plate line CP.

In Embodiment 3, in selecting, for example, a memory cell on the first row and in the first bit column connected to the first control line BS1, the potential of the first word line WL1 is set to an L level and the potential of the second through fourth word lines WL2 through WL4 are set to an H level, so that the upper electrodes and the lower electrodes of the ferroelectric capacitors 30 on the second through fourth rows are short-circuited. In this manner, the ferroelectric capacitor 30 included in the memory cell in the first bit column and on the first row is serially connected to the reading FET 10 of the first bit column. This semiconductor memory is thus equivalent to that of Embodiment 1.

Accordingly, a data write operation, a data read operation and an operation after data read are carried out in the same manner as in Embodiment 1, resulting in attaining the same effect as that of Embodiment 1.

In each of Embodiments 1 through 3, change of the potential of the gate electrode of the reading FET 10 depending upon whether a stored data is "1" or "0" is utilized in a read operation so that logical decision can be made on the basis of the modulation of the reading FET 10. Instead, the gate voltage of the reading FET 10 may be introduced to a sense amplifier so as to be compared with a reference voltage or to amplify a voltage difference between the gate voltage and a reference voltage for the logical decision.

What is claimed is:

1. A method for driving a semiconductor memory including a ferroelectric capacitor for storing a multi-valued data in accordance with a displacement of polarization of a ferroelectric film thereof and detection means connected to a first electrode corresponding to one of an upper electrode and a lower electrode of said ferroelectric capacitor for detecting the displacement of the polarization of said ferroelectric film, comprising:

a first step of reading said multi-valued data by detecting the displacement of the polarization of said ferroelectric film by said detection means with a reading voltage applied to a second electrode corresponding to the other of said upper electrode and said lower electrode of said ferroelectric capacitor; and a second step of removing said reading voltage applied to said second electrode, wherein said reading voltage applied in the first step has such magnitude that the displacement of the polarization of said ferroelectric film is restored to that obtained before reading said multi-valued data by removing said reading voltage in the second step.

2. The method for driving a semiconductor memory of claim 1, further comprising, after the second step, a third step of making a potential difference between said upper electrode and said lower electrode of said ferroelectric capacitor zero.

3. The method for driving a semiconductor memory of claim 2, wherein the third step includes a sub-step of applying a voltage with polarity different from polarity of said reading voltage to said first electrode before making said potential difference zero.

4. The method for driving a semiconductor memory of claim 2, wherein said semiconductor memory includes a switch for equalizing the potentials of said first electrode and said second electrode of said ferroelectric capacitor, and the third step includes a sub-step of making said potential difference zero with said switch.

5. The method for driving a semiconductor memory of claim 2, wherein said semiconductor memory includes a switch for equalizing the potentials of said first electrode of said ferroelectric capacitor and potential, and the third step includes a sub-step of applying a constant potential to said second electrode of said ferroelectric capacitor and making said potential difference zero with said switch.

6. The method for driving a semiconductor memory of claim 1, wherein said reading voltage applied in the first step has such magnitude that a voltage applied between said first electrode and said second electrode of said ferroelectric capacitor when said reading voltage is applied is smaller than a coercive voltage of said ferroelectric capacitor.

7. The method for driving a semiconductor memory of claim 1, wherein said detection means has a load capacitor, the first step includes a sub-step of applying said reading voltage to both ends of a series circuit composed of said ferroelectric capacitor and said load capacitor, and said detection means detects the displacement of the polarization of said ferroelectric film by detecting a voltage applied to said load capacitor that is obtained by dividing said reading voltage in accordance with a ratio between the capacitance of said ferroelectric capacitor and the capacitance of said load capacitor.

8. The method for driving a semiconductor memory of claim 1, wherein said detection means includes a field effect transistor formed on a substrate and having a gate electrode connected to said first electrode of said ferroelectric capacitor, the first step includes a sub-step of applying said reading voltage between said second electrode of said ferroelectric capacitor and said substrate, and said detection means detects the displacement of the polarization of said ferroelectric film by detecting a current flowing between a drain region and a source region of said field effect transistor when a voltage obtained by dividing said reading voltage in accordance with a ratio between the capacitance of said ferroelectric capacitor and the gate capacitance of said field effect transistor is applied to said gate electrode of said field effect transistor.

9. A method for driving a semiconductor memory including a plurality of successively connected ferroelectric capacitors each storing a multi-valued data in accordance with the displacement of polarization of a ferroelectric film thereof, a plurality of selecting transistors respectively connected to said plurality of ferroelectric capacitors for selecting one of said ferroelectric capacitors for reading said multi-valued data, and detection means connected to one end of said plurality of successively connected ferroelectric capacitors for reading said multi-valued data by detecting the displacement of the polarization of said ferroelectric film included in one ferroelectric capacitor selected by said selecting transistors, comprising:

a first step of applying a reading voltage to one of an upper electrode and a lower electrode of each of said ferroelectric capacitors; and a second step of removing said reading voltage applied to said one electrode, wherein said reading voltage applied in the first step has such magnitude that the displacement of the polarization of said ferroelectric film is restored to that obtained before reading said multi-valued data by removing said reading voltage in the second step.

10. The method for driving a semiconductor memory of claim 9, further comprising, after the second step, a third step of making a potential difference between said upper electrode and said lower electrode of said ferroelectric capacitor zero.

* * * * *